United States Patent
Tanaka (10) Patent No.: US 10,749,314 B2
(45) Date of Patent: Aug. 18, 2020

(54) METHOD OF EVALUATING INITIAL PARAMETERS AND TARGET VALUES FOR FEEDBACK CONTROL LOOP OF WAVELENGTH TUNABLE SYSTEM

(71) Applicant: SUMITOMO ELECTRIC DEVICE INNOVATIONS, INC., Yokohama (JP)

(72) Inventor: Hirokazu Tanaka, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 0 days.

(21) Appl. No.: 16/562,084

(22) Filed: Sep. 5, 2019

(65) Prior Publication Data

US 2020/0006917 A1    Jan. 2, 2020

Related U.S. Application Data

(62) Division of application No. 15/645,550, filed on Jul. 10, 2017, now Pat. No. 10,447,009.

(30) Foreign Application Priority Data

Jul. 11, 2016    (JP) .................. 2016-137116

(51) Int. Cl.
  *H01S 5/068*    (2006.01)
  *H01S 5/06*    (2006.01)
  (Continued)

(52) U.S. Cl.
  CPC .......... *H01S 5/0617* (2013.01); *H01S 5/0014* (2013.01); *H01S 5/02415* (2013.01);
  (Continued)

(58) Field of Classification Search
  CPC ...... H01S 3/13; H01S 5/0014; H01S 5/02415; H01S 5/0612; H01S 5/06256;
  (Continued)

(56) References Cited

U.S. PATENT DOCUMENTS 6,560,253 B1 * 5/2003 Munks ..................... G02B 5/20
                                                                372/20
9,557,243 B2   1/2017 Couch
(Continued)

FOREIGN PATENT DOCUMENTS

JP    06-112570 A    4/1994
JP    2004-047589 A    2/2004

*Primary Examiner* — Que Tan Le
(74) *Attorney, Agent, or Firm* — Baker Botts L.L.P.; Michael A. Sartori (57) ABSTRACT

A method of determining initial parameters and target values for tuning an emission wavelength of a wavelength tunable laser capable of emitting laser light in a substantial wavelength range is disclosed. The method iterates an evaluation of initial parameters and target values at target wavelengths in a preset order. The evaluation includes steps of supplying empirically obtained parameters to the t-LD, confirming whether the t-LD generates an optical beams, determining the initial parameters and the target values by carrying out feedback loops of the AFC and the APC when the t-LD generates the optical beam, or shifting the wavelength range so as to exclude the current target wavelength when the t-LD generates no optical beam.

2 Claims, 9 Drawing Sheets

(51) Int. Cl.
*H01S 5/0625* (2006.01)
*H01S 5/00* (2006.01)
*H01S 5/024* (2006.01)
*H01S 5/0683* (2006.01)
*H01S 5/125* (2006.01)

(52) U.S. Cl.
CPC .......... *H01S 5/0612* (2013.01); *H01S 5/0683* (2013.01); *H01S 5/06256* (2013.01); *H01S 5/06258* (2013.01); *H01S 5/06808* (2013.01); *H01S 5/125* (2013.01)

(58) Field of Classification Search
CPC ............. H01S 5/06258; H01S 5/06808; H01S 5/0683; H01S 5/125; H01S 5/0687
USPC ............................................. 250/214 R, 205
See application file for complete search history.

(56) References Cited

U.S. PATENT DOCUMENTS

| | | |
|---|---|---|
| 2004/0008995 A1 | 1/2004 | Ono et al. |
| 2011/0200062 A1 | 8/2011 | Shibata et al. |
| 2011/0228800 A1 | 9/2011 | Tanaka et al. |
| 2013/0343411 A1 | 12/2013 | Banno |
| 2014/0036940 A1 | 2/2014 | Tanaka et al. |
| 2014/0369369 A1 | 12/2014 | Tanaka |
| 2015/0036705 A1 | 2/2015 | Tanaka et al. |
| 2015/0063383 A1 | 3/2015 | Tanaka et al. |
| 2015/0063384 A1 | 3/2015 | Miyata et al. |
| 2015/0117479 A1 | 4/2015 | Miyata |
| 2015/0117482 A1 | 4/2015 | Shibata |
| 2015/0155679 A1 | 6/2015 | Miyata |
| 2015/0188284 A1 | 7/2015 | Miyata |
| 2015/0222077 A1 | 8/2015 | Miyata |
| 2015/0222078 A1 | 8/2015 | Miyata |

* cited by examiner

METHOD OF EVALUATING INITIAL PARAMETERS AND TARGET VALUES FOR FEEDBACK CONTROL LOOP OF WAVELENGTH TUNABLE SYSTEM

CROSS REFERENCE TO RELATED APPLICATION

The present application is a divisional application of U.S. patent application Ser. No. 15/645,550 filed Jul. 10, 2017, which is based upon and claims the benefit of priority under 35 USC 119 of Japanese Patent Application No. 2016-137116 filed on Jul. 11, 2016, the entire disclosure of which is incorporated herein by reference in its entirety.

BACKGROUND OF THE INVENTION

Field of the Invention

The present invention relates to a wavelength tunable laser system and a method of tuning the wavelength thereof.

Related Background Arts

A wavelength tunable laser and a system implementing such a wavelength tunable laser are known in the field. For instance, a Japanese Patent Application laid open No. H06-112570A has disclosed such an apparatus. A wavelength tunable laser (t-LD) in the oscillation wavelength thereof may be tuned by parameters stored in a memory, where the parameters are evaluated by practically driving the t-LD in advance to a delivery of the t-LD. At-LD is generally requested to be operable in a wavelength range set by the specification or by requests in the field. Accordingly, the evaluation of the parameters is first performed in an intermediate wavelength within the wavelength range, then, expanded toward shorter and longer wavelengths. However, a t-LD sometimes is unable to oscillate at wavelengths border of the wavelength range. Or, when the evaluation of the parameters is first performed in one of borders in the wavelength range then expanded toward another border, a t-LD sometimes is unable to oscillate in wavelengths close to the another border. In those cases, the parameters already obtained become waste.

SUMMARY OF INVENTION

One aspect of a present invention relates to a method of determining initial parameters and target values for feedback loops of an auto-power control (APC) and an auto-frequency control (AFC) that tunes a wavelength and adjust power of an optical beam output from a wavelength tunable laser (t-LD). The t-LD of the present invention is operable at a plurality of target wavelengths within the wavelength range and attributed to an optical gain with a maximum in a center of the wavelength range bur gradually decreasing in peripheries therein. The method of the invention includes: iterating an evaluation of initial parameters and target values at target wavelengths by a preset order, where the evaluation includes steps of, (a) supplying parameters to the t-LD where the parameters are empirically obtained; (b) confirming whether the t-LD generates an optical beam with a wavelength around a current target wavelength or not; (c-1) when the t-LD generates the optical beam, performing feedback loops of the AFC and the APC for determining the initial parameters and the target values at the respective target wavelengths, and (d-1) storing the initial parameters and the target values in a memory as linking with the target wavelengths, or (c-2) when the t-LD generates no optical beam or unstably operates, shifting the wavelength range so as to exclude the current target wavelength. A feature of the method of the present invention is that the preset order is alternately arranged between a shortest target wavelength and a longest target wavelength at which the evaluations are not performed yet.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to accompany drawings. The present invention is not restricted to the embodiment, and has a scope defined in claims and every modification within the claims and equivalents thereto. Also, in the description of the drawings, numerals or symbols same with or similar to each other will refer to elements same with or similar to each other without duplicating explanations.

First Embodiment

Figure 1:
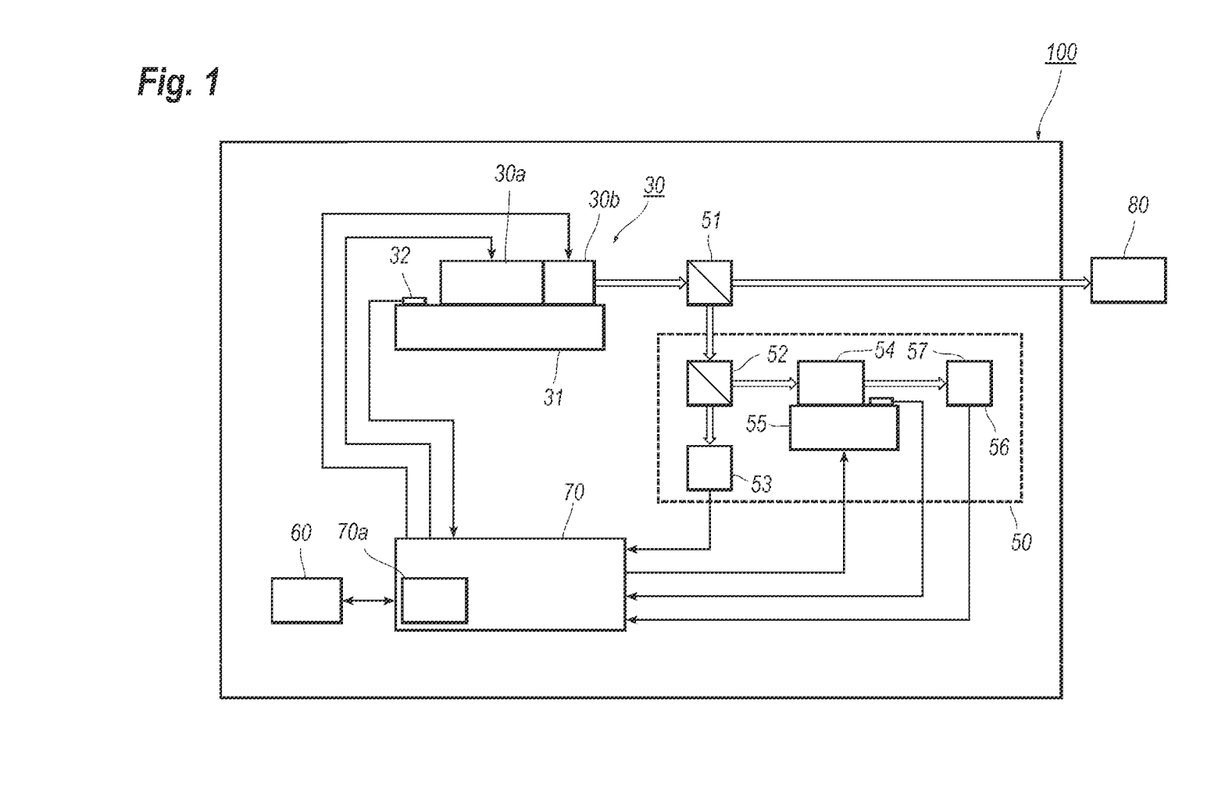
FIG. 1 shows a functional block diagram of a wavelength tunable system according to the present invention.

FIG. 1 shows a functional block diagram of an apparatus of a wavelength tunable laser system 100 that includes a wavelength tunable laser (t-LD) 30 that integrates a semiconductor optical amplifier (SOA) that operates as a power controller of the wavelength tunable laser system 100. The SOA may adjust the magnitude of an optical beam output from the t-LD 30 but fully cut the output power of the t-LD 30. The wavelength tunable system 100 may further include a wavelength locker 50, a memory 60, and a controller 70 that integrates another memory type of a random access memory (RAM) therein.

Figure 2:
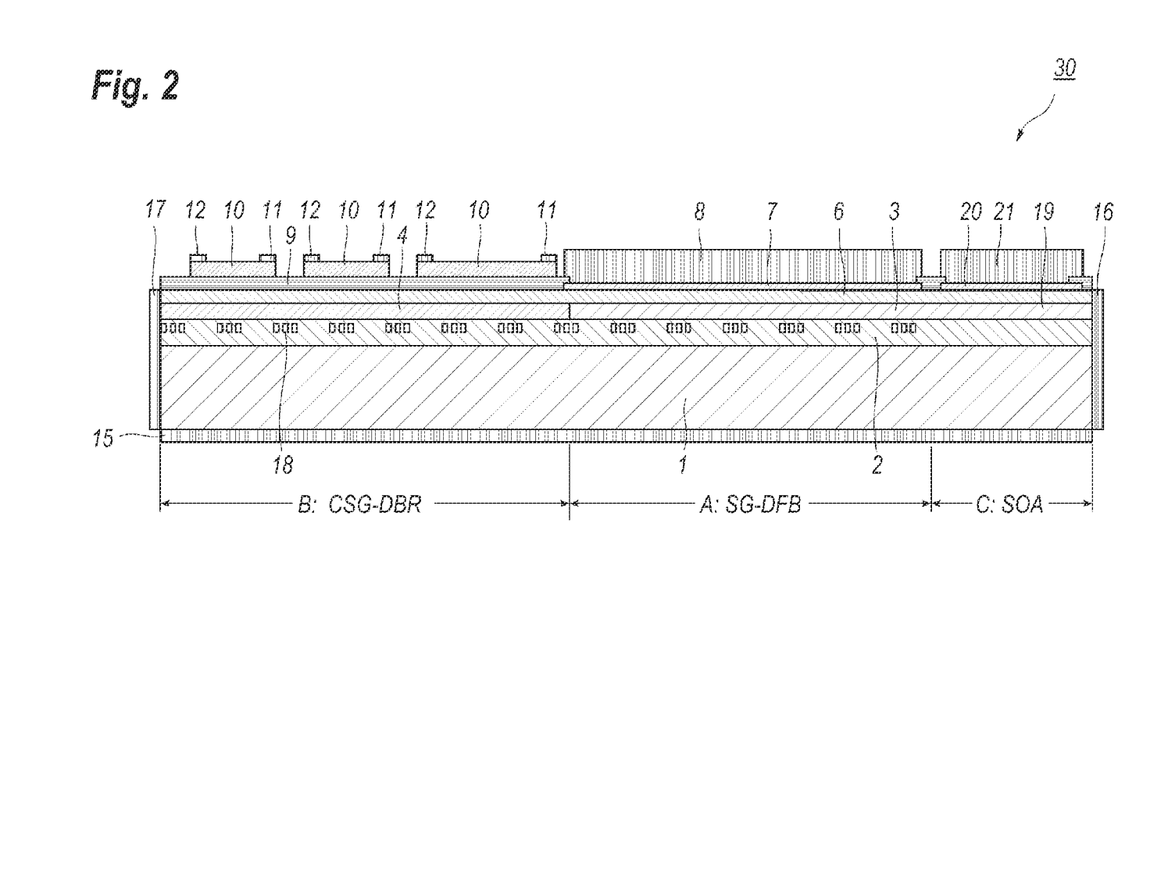
FIG. 2 shows a cross section of a wavelength tunable laser (t-LD) implemented within the wavelength tunable system shown in FIG. 1.

FIG. 2 shows a cross section of the t-LD 30, where the t-LD 30 includes a sampled grating distributed feedback (SG-DFB) region A, a chirped sampled grating distributed Bragg reflector (CSG-DBR) B, and a semiconductor optical amplifier (SOA) C, where the arrangement of the t-LD 30 of the present embodiment may be regarded as a semiconductor laser including a wavelength selective mirror within the semiconductor structure.

The CSG-DBR region B, the SG-DFB region A, and the SOA region C are arranged in this order from a front side toward a rear side. The SG-DFB region A has an optical gain and a sampled grating that includes grating regions 18 and space regions alternately arranged to each other along the optical axis of the t-LD 30. The SG-DFB region A and the CSG-DFB region B constitute a laser region 30*a*, while, the SOA region C corresponds to the SOA region 30*b* each shown in FIG. 1.

The SG-DFB region A includes a lower cladding layer 2, an active layer 3, an upper cladding layer 6, a contact layer 7, and an electrode 8 stacked on a substrate 1 in this order. The CSG-DBR region B includes, also on the substrate 1, the lower cladding layer 2, a waveguide layer 4, the upper cladding layer 6, an insulating layer 9, and some heaters 10, stacked also on the substrate 1 in this order. The SOA region C includes the lower cladding layer 2, an optical amplifying layer 19, the upper cladding layer 6, a contact layer 20, and an electrode 21 also stacked on the substrate 1 in this order. The lower cladding layer 2, and the upper cladding layer 6, extend in all regions A to C; while, the active layer 3, the waveguide layer 4, and the optical amplifying layer 19 are specific to the respective regions, A to C, but lower interfaces thereof against the top of the lower cladding layer 2 are leveled in all regions, A to C. Also, an interface between the SG-DFB region A and the CSG-DBR region B corresponds to an interface between the active layer 3 and the waveguide layer 4.

The SOA region C has a facet, a front facet, covered with a film 16 that extends from the substrate 1 to the upper cladding layer 6. The film 16 is a type of, what is called as an anti-reflection (AR) film. The CSG-DBR region B provides another facet, a rear facet, also covered with a film 17 that extends from the substrate 1 to the upper cladding layer 6. The other film 17 is also a type of the anti-reflection (AR) film. The substrate 1, the lower cladding layer 2, and the upper cladding layer 6 may be made of n-type InP, n-type InP and p-type InP, respectively. The lower cladding layer 2 and the upper cladding layer 6 show a function of optical confinement for the active layer 3, the wavelength layer 4, and the optical amplifying layer 10.

The active layer 3, which may be made of semiconductor material having an optical gain, has a quantum well structure comprising a plurality of well layers each made of $Ga_{0.32}In_{0.68}As_{0.92}P_{0.08}$ with a thickness of 5 nm and a plurality of barrier layers each made of $Ga_{0.22}In_{0.78}As_{0.47}P_{0.53}$ with a thickness of 10 nm, where the well layers and the barrier layers are alternately stacked to each other. The waveguide layer 4 may be made of bulk material, for instance, bulk $Ga_{0.22}In_{0.78}As_{0.47}P_{0.53}$, with bandgap energy greater than that of the active layer 3.

The optical amplifying layer 19 has an optical gain by supplying a bias current through the electrode 21 and shows a function of the optical amplification. The optical amplifying layer 19 may also have the quantum well structure comprising a plurality of well layers made of $Ga_{0.35}In_{0.65}As_{0.99}P_{0.01}$ with a thickness of 5 nm and a plurality of barrier layers made of $Ga_{0.15}In_{0.85}As_{0.32}P_{0.68}$ with a thickness of 10 nm, where the well layers and the barrier layers are alternately stacked to each other. In an alternative, the optical amplifying layer 19 may be a bulk material made of $Ga_{0.44}In_{0.56}As_{0.95}P_{0.05}$.

The contact layers, 7 and 20, may be made of p-type $Ga_{0.47}In_{0.53}As$. The insulating layer 9 is made of silicon nitride (SiN) or silicon oxide ($SiO_2$). The heaters 10 are a thin film resistor made of composite metal of titanium tungsten (TiW). The heaters 10 each may extend several segments in the CSG-DBR region, where one segment is consisted of one grating region and one space region neighbor to the grating region.

The electrodes, 8 and 21, and electrodes, 11 and 12, may contain gold (Au). Also, the substrate 1 provides a back metal 15 in a bottom surface thereof opposite to a surface on which the lower cladding layer 2 is formed. The back metal 15 extends in the whole regions, A to C.

The facet films, 16 and 17, are each an AR film having reflectivity less than 1.0% viewed from the SOA region C and the CSG-DBR region B, respectively, which means that the facet films, 16 and 17, cause no reflection for light subject to the t-LD 30. The facet films, 16 and 17, are made of, for instance, magnesium fluoride ($MgF_2$) and/or titanium oxide ($TiO_2$). In an alternative, a t-LD may have the facet films having substantial reflectivity. For instance, a t-LD providing an optical absorption region in an outer side of the CSG-DBR region B, a facet film 17 with substantial reflectivity may suppress light leaking out from the facet film 17. The substantial reflectivity is, for instance, greater than 10%.

The grating regions 18 exist in the SG-DFB region A and the CSG-DBR region B putting the space regions therebetween. Such an arrangement of the grating regions 18 and the space regions is called as the sampled grating. One grating region and one space region neighbor to the one grating region constitutes one segment in the lower cladding region 2. In other words, one space region sandwiched by the grating regions and one of grating regions putting the space region therebetween constitutes the segment. The grating regions 18 each include periodically distributed corrugations made of semiconductor material having refractive index different from that of the lower cladding layer 2. When the lower cladding layer is made of InP, the periodically distributed corrugation may be made of, for instance, $Ga_{0.22}In_{0.78}As_{0.47}P_{0.53}$. The reason why the periodically distributed regions are called as the corrugations is that, during a process of forming the grating regions 18, the lower cladding layer 2 in a surface thereof is etched to form a corrugation, and this corrugation is to be buried with a semiconductor material of quaternary compound of $Ga_{0.22}In_{0.78}As_{0.47}P_{0.52}$. Thus, the grating regions 18 may show traces of the corrugation.

The grating region 18 may be formed by, for instance, two beams interference exposure technique, while, the space regions between the grating regions 18 may be formed by double exposure technique, that is, after the two beams interference exposure for the grating regions, only the space regions are exposed to beams. The grating regions 18 in the SG-DFB region A in the corrugations thereof may have a pitch same with a pitch of the corrugations in the grating regions in the CSG-DBR region B, or the corrugations in the grating regions 18 may have respective pitches different from each other. Also, the grating regions 18 in the respective segments may have a length along the optical axis common to the respective grating regions 18, or respective lengths difference from each other. In an alternative, the grating regions 18 in the SG-DFB region A may have a length common to the respective regions 18 and the grating regions 18 in the CSG-FOR region B may have another length common to the respective regions 18, however, the former length in the SG-DFB region A is difference from the length in the CSG-DFB region B.

The segments in the SG-DFB region A have an optical length thereof substantially equal to each other, while, at least two segments in the CSG-DBR region B have optical lengths different from each other. Accordingly, an average of the optical lengths of the segments in the SG-DFB region A is different from an average of the optical lengths of the segments in the CSG-DBR region B. Thus, the segments in the SG-DFB region A and the segments in the CSG-DBR region B constitute a cavity in the t-LD 30.

As described, the SG-DFB region A and the CSG-DBR region B constitute the laser cavity within which light reflected in the SG-DFB region A and the CSG-DBR region B interferes. The SG-DFB region A provides the active layer 3, which inherently shows an optical gain spectrum having a plurality of peaks with even magnitudes and a specific period to neighbor peaks. On the other hand, the CSG-DBR region B causes a reflection spectrum with a plurality of peaks each having magnitudes different from each other but a specific period to neighbor peaks, where the period between the gain peaks attributed to the SG-DFB region A is different from the period between the reflection peaks attributed to the CSG-DBR region B. Accordingly, the t-LD 30 may oscillate at a wavelength at which one of the gain peaks in the SG-DFB region A coincides with one of the reflection peaks attributed to the CSG-DBR region B, and the wavelength at which the laser emission occurs may be tuned by varying the period and the wavelengths of the gain peaks and the period and the wavelengths of the reflection peaks.

As FIG. 1 indicates, the t-LD 30 is mounted on the first thermos-electric controller (TEC) 31 that includes a Peltier Elements. The TEC 31 may operate as or show a function of a temperature controller. The first thermistor 32 is also mounted on the first TEC 31, which senses a temperature of the TEC 31. The t-LD 30 in a temperature thereof may be estimated through the sensed result of the first thermistor 32.

The wavelength locker 50 includes beam splitters (BS), 51 and 52, first and second photodiodes (PDs), 53 and 56, an etalon 54, a second TEC 55, and a second thermistor 51. The BS 51 is set on a position where the BS 51 may split a beam coming from the front facet of the t-LD 30, while, the other BS 52 is set on a position where the BS 52 may split one of beams split by the former BS 51. The first PD 53 is set at a portion to detect one of the beams split by the latter BS 52. The etalon 54 inherently has periodical transmittance for light entering therein. The embodiment may implement, what is called, a solid etalon as the etalon 54. The solid etalon has the transmittance whose period depends on a temperature thereof. Accordingly, the etalon 54 of the present embodiment is set at a positon to transmit one of the beams split by the second BS 52 an on the second TEC 55 that may include Peltier elements and operate as a temperature controller. The second PD 56 is set at a position where the second PD may detect a beam passing the etalon 54. The second thermistor 57, which is mounted on the second TEC 55, may control or vary a temperature of the etalon 54.

The memory 60 is a type of rewritable memory, typically, a flash memory. The controller 70 implements a central processing unit (CPU), random access memories (RAMs) 70a, a power supply, and so on. The RAMs 70a may store programs the CPU executes and data the CPU referrers to. The memory 60 may hold parameters for initial operations of the wavelength tunable laser system 100 and/or target values for feedback operations each linked with respective channels or wavelengths, which are sometimes called as target wavelengths. For instance, the target wavelengths correspond to wavelength grids determined by an international organization called as ITU-T (International Telecommunication Union Telecommunication Standardization Sector). The specification herein below sometimes calls the wavelengths each corresponding to the wavelength grids above as the grid wavelengths.

Table below exemplarily lists initial parameters and target values to be held within the memory 60. The initial parameters are a bias current $I_{LD}$ supplied to the electrode 8 in the SG-DFB region A, a bias current $I_{SOA}$ supplied to the electrode 21 in the SOA region C, a temperature $T_{LD}$ set in the TEC 31 for the t-LD 30, and power, $P_{Heater1}$ to $P_{Heater3}$, supplied to the respective heaters 10 in the CSG-DBR region B; while, the target values of the feedback control includes a photocurrent $I_{m1}$ output from the first PD 53 and a ratio $I_{m2}/I_{m1}$ of the photocurrents, that is, an output from the second PD 56 against that from the first PD 53. These initial parameters and target values are prepared for the respective wavelength grids and evaluated using the wavelength monitor 80 in advance to the delivery of the wavelength tunable system.

TABLE I

| | initial parameters | | | | | | target values | |
| --- | --- | --- | --- | --- | --- | --- | --- | --- |
| Grid | $I_{LD}$ [mA] | $I_{SOA}$ [mA] | $T_{LD}$ [° C.] | $P_{Heater1}$ [mW] | $P_{Heater2}$ [mW] | $P_{Heater3}$ [mW] | $I_{m1}$ [µA] | $I_{m2}/I_{m1}$ |
| 1 | 150.0 | 67.4 | 52.5 | 29.4 | 57.5 | 50.7 | 315 | 1.18 |
| 2 | 150.0 | 47.7 | 34.5 | 64.4 | 81.3 | 72.5 | 317 | 1.52 |
| 3 | 150.0 | 50.9 | 38.7 | 59.1 | 77.7 | 69.1 | 313 | 1.23 |
| ⁞ | ⁞ | ⁞ | ⁞ | ⁞ | ⁞ | ⁞ | ⁞ | ⁞ |
| n | 150.0 | 54.8 | 54.0 | 41.2 | 43.3 | 11.7 | 317 | 1.44 |

Next, an operation of the wavelength tunable system will be described as referring to FIGS. 1 and 2. An external system notifies the target wavelength, namely, one of the grid wavelengths, to the controller 70, and then the controller 70, responding the instruction of the external system, reads the initial parameters and the target values from the memory 60 corresponding to the target wavelength and sets thus fetched information in a temporal memory implemented within the controller 70. The memory 60, as described above, stores the initial parameters and the target values linking with the wavelengths. However, the memory implemented within the controller 70 may temporarily hold the parameters and the values only for the target wavelength. The controller 70 reads the initial parameters of the bias currents, $I_{LD}$ and $I_{SOA}$, the temperature $T_{LD}$, and the heater power, $P_{Heater1}$ to $P_{Heater3}$, and supplies the bias current $I_{LD}$ to the SG-DFB region A through the electrode 8 thereof.

Also, the controller 70 drives the TEC 31 so as to set a temperature thereof equal to the initial temperature $T_{LD}$, which also sets the temperature of the t-LD 30 substantially equal to the initial temperature $T_{LD}$. Moreover, the controller 70 further provides the power, $P_{Heater1}$ to $P_{Heater3}$, to the heaters 10 in the CSG-DBR region B, which adjusts the reflection spectrum attributed to the CSG-DBR region B; and supplies the initial bias current $I_{SOA}$ to the SOA region C. The temperature $T_{LD}$ of the t-LD 30 and those of the heaters 10 may oscillate the t-LD 30 at a wavelength vicinity of the grid wavelength, and the bias currents, $I_{LD}$ and $I_{SOA}$, may set the magnitude of the optical beam output from the t-LD 30 substantially equal to the target power; but the wavelength and the magnitude of the optical beam do not always coincide with the target wavelength and the target power. Accordingly, the feedback control subsequently carried out may set the wavelength and the magnitude to be equal to the grid wavelength and the target power.

The feedback control by the controller 70 is sometimes defined as the auto-power-control (APC) and the auto-frequency-control (AFC). Specifically, in the APC, the controller 70 adjusts the bias current $I_{SOA}$ supplied to the SOA region C such that the photocurrent $I_{m1}$ sensed through the first PD 53 coincides with the target photocurrent, which means that the magnitude of the optical beam output from the t-LD 30 coincides with the target power. On the other hand in the AFC, the controller 70 adjusts the temperature $T_{LD}$ of the TEC 31 such that the ratio of the photocurrents where $I_{m2}$ is the photocurrent output from the second PD 56, coincides with the target ratio of the target wavelength. Thus, the wavelength and the magnitude of the optical beam output from the t-LD 30 may be precisely adjusted in the target wavelength and the target power at the target wavelength.

Figure 3:
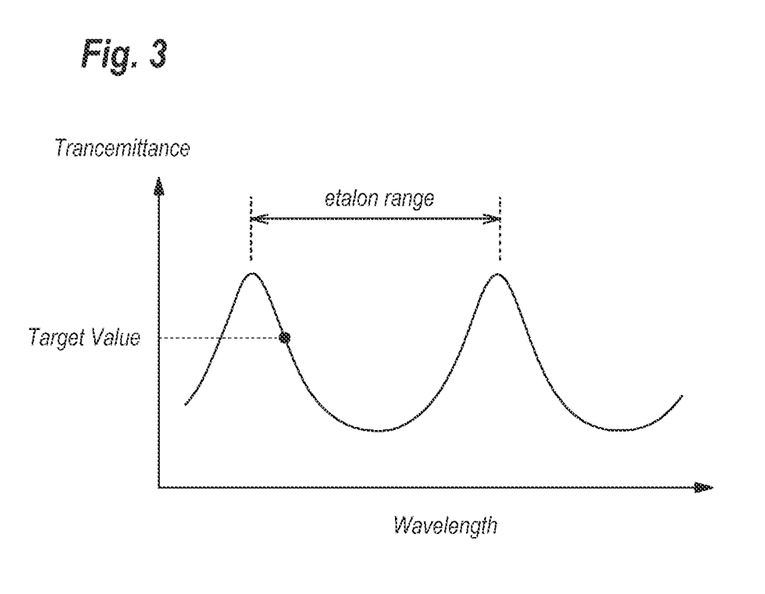
FIG. 3 shows typical transmittance of etalon.
Figure 4:
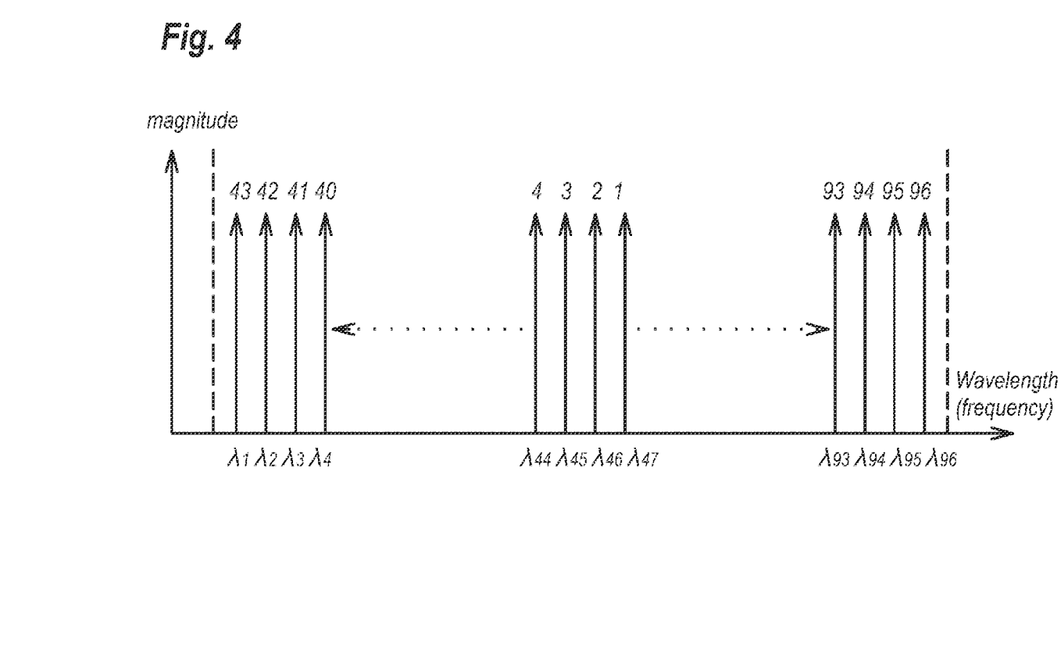
FIG. 4 shows an example of an order for evaluating initial parameters and target values for driving the t-LD, which is comparable to the present invention.

An algorithm of the AFC using the ratio of the photocurrents $I_{m2}/I_{m1}$ will be further precisely explained. FIG. 4 shows exemplary transmittance of an etalon, where the horizontal axis denotes a wavelength and the vertical axis corresponds to the transmittance. The transmittance of an etalon periodically varies as FIG. 3 shows. In the wavelength tunable system 100 applicable to a system following the ITU-T standard, an etalon with a period in the transmittance spectrum of around 100 GHz is preferably selected because the ITU-T standard for the wavelength division multiplexing (WDM) communication system defines a minimum span between two grids to be 50 GHz in a range of 192 to 197 THz.

Because an etalon 54 has the transmittance shown in FIG. 4, taking the ratio of optical beams outgoing from the etalon 54 against that incoming into the etalon, which corresponds to the transmittance, the wavelength of the optical beam may be estimated. The former beam, outgoing from the etalon 54, may be detected through the second PD 56 as the photocurrent $I_{m2}$, while, the former beam, incoming into the etalon 54, may be detected through the first PD 53 as the photocurrent $I_{m1}$. Thus, the ratio of the two photocurrents gives the transmittance of the etalon, namely, the wavelength of the optical beam just incoming into the etalon 54, and the feedback control of the AFC sets this ratio $I_{m2}/I_{m1}$ equal to the transmittance of the etalon 54 at the target wavelength by adjusting the temperature of the TEC 31.

The ratio $I_{m2}/I_{m1}$ in the target value thereof is preferably intermediate between the maxima and the minima in the transmittance of the etalon 54, because midways give substantial slopes in the transmittance, which may increase the closed loop gain of the AFC. While, when the target value of the ratio $I_{m2}/I_{m1}$ is set close to the maximum or the minimum in the transmittance where the variation of the transmittance against the wavelength becomes relatively small, the feedback loop of the AFC becomes hard to set a substantial loop gain and an error range around the target grid wavelength expands.

As described, when the target wavelengths follow the grid wavelengths defined in the ITU-T, the wavelength tunable system 100 preferably implements an etalon 54 having a period in the transmittance thereof substantially equal to the span of the ITU-T grids. In such a case, the etalon 54 in the temperature thereof is unnecessary to be adjusted because once sets a temperature of the etalon 54 at one grid wavelength, wavelengths showing the transmittance of the etalon 54 same with that once determined by the AFC correspond to the grid wavelengths of the ITU-T system. Thus, in order to drive the t-LD 30 exactly at the target grid wavelength, two procedures are inevitable where the t-LD 30 is firstly driven by the initial parameters and secondly driven by AFC using the target values.

Next, procedures using the wavelength monitor 80 to evaluate the initial parameters and the target values to be set within the memory 60 of the system 100 will be described. First, a procedure comparable to the present embodiment will be described as referring to FIG. 4, where FIG. 4 indicates the grid wavelengths, $\lambda_1$ to $\lambda_{96}$, and orders thereof whose initial parameters and target values are to be evaluated by numerals above the arrows. Broken lines indicate a wavelength range where the t-LD 30 may oscillate, or a wavelength range the ITU-T defines.

The procedure comparable to the present invention first drives the t-LD 30 at a wavelength in an intermediate wavelength range, for instance, the grid wavelength $\lambda_{47}$, by supplying initial parameters to the t-LD, which are empirically obtained or estimated in advance to the procedures described herein. For instance, the empirical parameters may be obtained for another t-LD whose initial parameters are obtained just before the subject t-LD. In another case, the empirical parameters are those obtained for another target wavelength just before the present target wavelength. The empirical parameters include the bias currents, $I_{LD}$ and $I_{SOA}$, the temperature $T_{LD}$ of the TEC 31, and the power, $P_{Heater1}$ to $P_{Heater3}$, for the heaters 10. The t-LD 30 is first driven by such empirical parameters. Then, the feedback control of the AFC sets the wavelength of the optical beam just output from the t-LD 30 equal to the target wavelength by adjusting the temperature of the t-LD 30 as monitoring the output beam by the wavelength monitor 80. When the wavelength of the optical beam currently output from the t-LD and output power thereof coincide with the target wavelength and the target power, the controller 70 stores the parameters and the target values of the photocurrents, $I_{m1}$ and $I_{m2}$, in the memory implemented therein and transfers those parameters and values to the memory 60 as linking with the target wavelength.

Then, the evaluation iterates the procedures for obtaining the initial parameters and the target values using the wavelength monitor 80 for the shorter target wavelengths, $\lambda_{46}$ to $\lambda_1$, and stores those initial parameters and target values determined by the AFC and the APC at the respective target wavelengths, $\lambda_{46}$ to $\lambda_1$, in the external memory 60. In the AFC and the APC at one target wavelength, the empirical parameters first set in the t-LD 30 and the TEC 30 may refer to those determined for the target wavelength immediate before the current target wavelength.

The comparable procedure thus described determines the initial parameters and the target values first for a target wavelength in a center of the wavelength range, then, iterates the evaluation to the shorter wavelengths and finally from a center of the wavelength range toward the longer wavelengths. One of reasons why the procedure comparable to the present invention begins at a center wavelength is that the t-LD 30 may oscillate stably at center wavelength in the wavelength range. This reason should be understood by mechanisms described below.

Figure 5A:
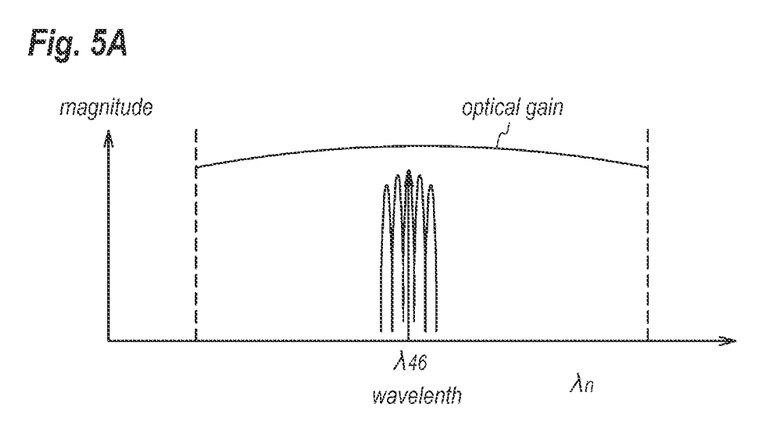
FIGS. 5A and 5B show wavelength dependence of magnitudes of an optical beam output from the t-LD and an optical gain attributed to the t-LD.
Figure 5B:
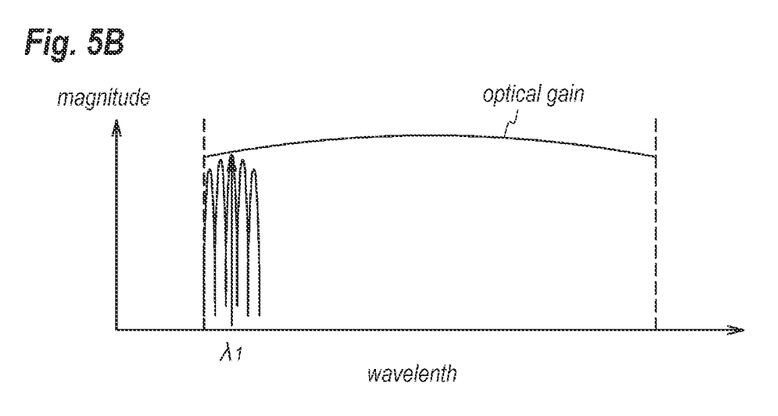

FIGS. 5A and 5B show the gain spectra in the SG-DFB region A, and the magnitudes of the optical beam output from the t-LD 30. The gain spectra, as illustrated in FIGS. 5A and 5B, show a convex behavior. Specifically, the optical gain in the SG-DFB region A becomes greater in a center of the wavelength range compared with those in peripheral regions. When the optical gain in the magnitude thereof is enough in the peripheral regions, even if the optical gain becomes smaller compared with those in the center of the wavelength range, the t-LD 30 may stable operate even at the peripheral regions, and the initial parameters and the target values may be obtained by the AFC and the APC, as shown in FIGS. 5A and 5B.

Figure 6A:
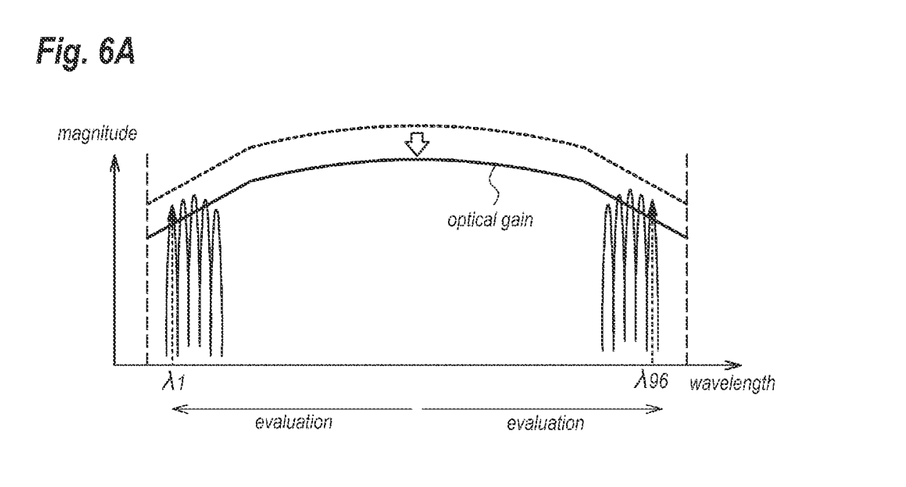
FIGS. 6A and 6B show another wavelength dependence of magnitudes of an optical beam output from the t-LD and an optical gain attributed to the t-LD.
Figure 6B:
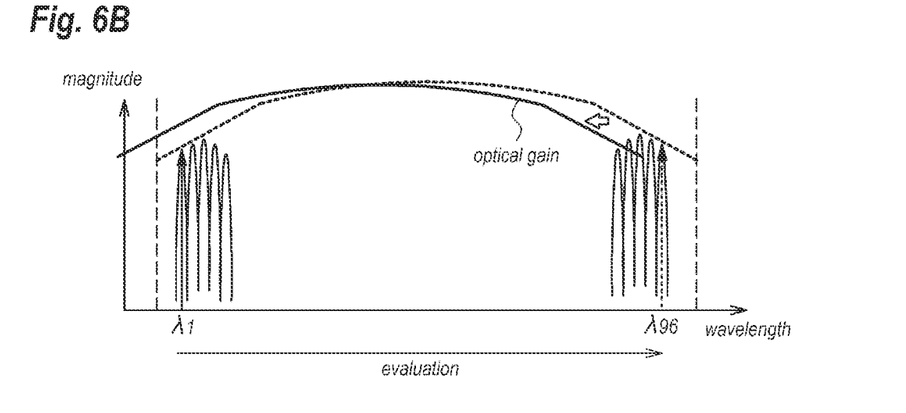

However, some of t-LDs show the optical gain that is insufficient for a t-LD to operate stably. In such a case, as shown in FIGS. 6A and 6B, the t-LD may not operate stably at the peripheral wavelengths, for instance, $\lambda_1$ and $\lambda_{96}$, even when the system supplies the initial parameters that are empirically obtained, or those obtained for a target wavelength just before the iteration of the measurement. FIG. 6A schematically illustrates a case where the t-LD 30 may be un-operable at both of longer and shorter wavelengths in the wavelength range for a reduced optical gain, while, FIG. 6B show another cases where the t-LD may not operate at least one of the longer and shorter wavelengths. When a t-LD may not stably operate, the feedback control of the AFC and the APC for obtaining the initial parameters and the target values becomes meaningless no longer. Moreover, when such a situation occurs, namely, a t-LD may not operate stably, the initial parameters and the target values, which are obtained for the target wavelengths at which the t-LD may operate stably, becomes useless because such a t-LD becomes unable to be delivered.

First Embodiment

Therefore, the present invention may provide an algorithm that may not waste the initial parameters and the target values that are evaluated for the precedent grid wavelengths.

Figure 7:
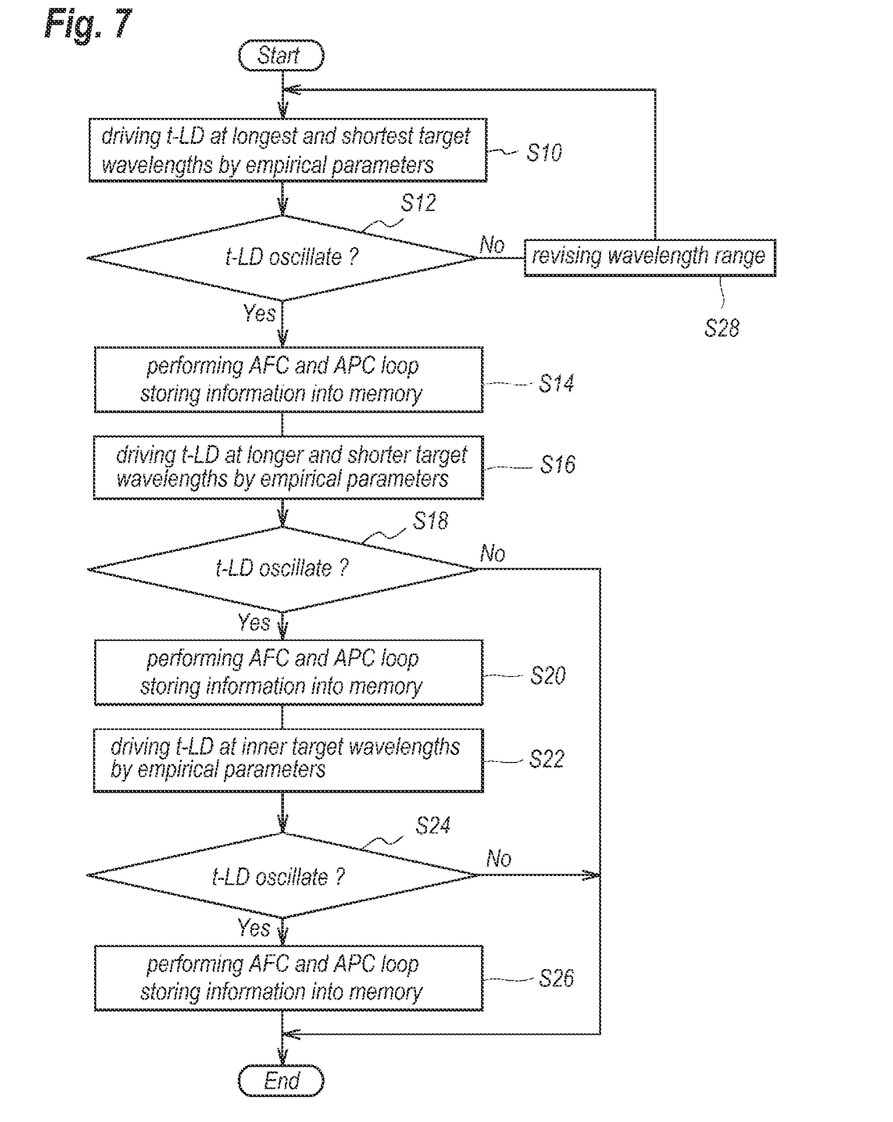
FIG. 7 shows a flow chart for evaluating the initial parameters and the target values for driving the t-LD at respective wavelengths.
Figure 8A:
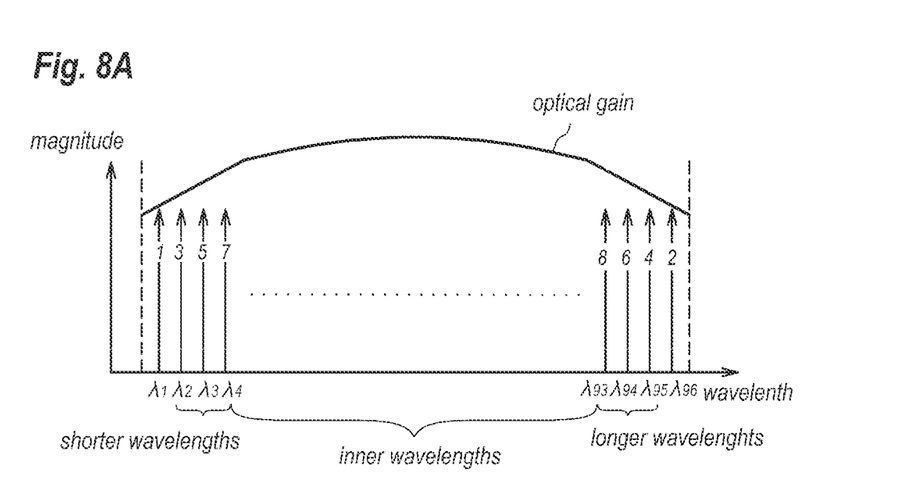
FIGS. 8A and 8B schematically show an order for evaluating the initial parameters and the target values for driving the t-LD according the embodiment of the present invention.
Figure 8B:
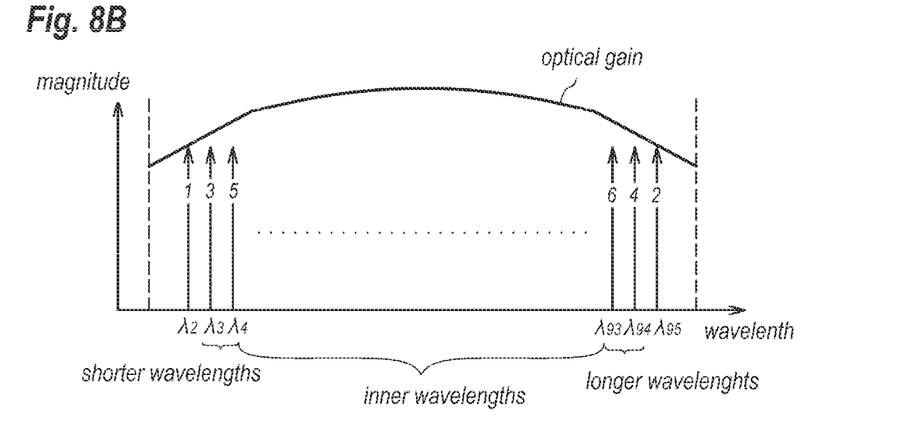

FIG. 7 shows a flow chart for evaluating the initial parameters and the target values first set for the t-LD 30 and the feedback loop of the AFC and the APC according to embodiment of the present invention; while, FIGS. 8A and 8B schematically illustrate an order of the target wavelengths at which the evaluation of the parameters and the values are carried out. FIGS. 8A and 8B denote the wavelengths in the horizontal axis, while, the magnitudes of the optical beam output from the t-LD 30 in the vertical axis thereof. Also, solid lines in FIGS. 8A and 8B, schematically indicates the optical gain attributed to the SG-DFB region A, and numerals indicating the arrows corresponds to the order by which the evaluation of the parameters and the values are carried out.

Specifically, at step S10, the t-LD 30 is first driven by the parameters, which are empirically determined for the t-LD 30 with the arrangement shown in FIG. 2, for the shortest target wavelength $\lambda_1$ and for the longest target wavelength $\lambda_{96}$. The parameters are the bias currents, $I_{LD}$ and $I_{SOA}$ supplied to the SG-DFB region A and to the SOA region C, respectively; the temperature Tu of the t-LD 30, the power, $P_{Heater1}$ to $P_{Heater3}$ provided to the heaters 10, where those parameters may be common to all target wavelengths, $\lambda_1$ and $\lambda_{96}$.

Then, the system checks through the wavelength monitor 80 whether the t-LD 30 in the output wavelength thereof may be nearby shortest and longest target wavelengths at step S12. When the t-LD 30 may generate the optical beam, the laser light, which corresponds to "Yes" at step S12, the system performs the feedback loops of the AFC and the APC such that the optical beam currently output from the t-LD 30 in the wavelength thereof coincides with the longest and shortest wavelengths, and the power thereof becomes equal to the target power. After the optical beam currently output from the t-LD 30 coincides in the wavelength thereof and in the power thereof with the target wavelength and the power, the system stores at step S14 the parameters currently set in the t-LD 30 and the TEC 31, and the photocurrents, $I_{m1}$ and $I_{m2}$, evaluated through the feedback loop of the AFC and the APC, as the initial parameters and the target values at the shortest and the longest wavelengths.

Thereafter, the system advances the procedures for evaluating the parameters and the values in relatively shorter target wavelengths, $\lambda_2$~$\lambda_4$, and relatively longer target wavelengths, $\lambda_{93}$~$\lambda_{95}$, by setting the empirically obtained parameters, confirming whether the t-LD 30 generates an optical beam or not, and performing the feedback loop of the AFC and APC. In those steps, the system preferably performs the evaluation of the parameters and values alternately in the shorter target wavelengths and the longer target wavelengths from the longer and shorter ones. That is, after the evaluation for the shortest and the longest wavelengths, $\lambda_1$ and $\lambda_{96}$, the system preferably performs the evaluation at the wavelength $\lambda_2$ that is the shortest wavelength among the target wavelengths not performing the evaluation yet, then at the wavelength $\lambda_{95}$ that is the longest wavelength among the target wavelengths not performing the evaluation yet, and so on.

When the procedures thus described once find a target wavelength at which the t-LD 30 may not generate an optical beam and the feedback loop of the AFC and the APC to get the parameters is unable to carry out, which corresponds to No at step S18, the system ceases the evaluation of the parameters and the values, and decides that a t-LD 30 currently evaluating the parameters thereof is an inferior product and ceases the subsequent procedures, which efficiently saves a time to find a failure device. On the other hand, the t-LD 30 may generate an optical beam at respective shorter and longer target wavelengths and the subsequent feedback loop of the AFC and the APC may be carried out, which corresponds to "Yes" at step S18, the system stores the initial parameters and the target values evaluated through the feedback control in the memory 60 as linking with the target wavelengths at step S20.

The system further advances the evaluation of the parameters and the values for the target wavelengths in a center region of the wavelength range at step S22. For those target wavelengths, the order of the evaluation becomes optional because most t-LD having the arrangement shown in FIG. 2 may stably generate an optical beam in those wavelengths. The order of the evaluation may be carried out one by one from the shortest target wavelength not performing yet to a longer target wavelength, from the longest target wavelength not performing yet to a shorter wavelength, or alternately in shorter target wavelengths and longer target wavelengths from a center target wavelength.

The system confirms through the wavelength monitor 80 whether the t-LD 30 may generate an optical beam at respective target wavelengths at step S24. When the t-LD 30 generate the optical beam, which corresponds to "Yes" at step S24, the system obtains the initial parameters and the target values through the feedback control of the AFC and APC, and stores the information into the memory 60 as linking with the target wavelength in step S26. On the other hand, the t-LD 30 may generate no optical beam, which corresponds to "No" at step S24, the system ceases the evaluation and decides the t-LD 30 is an inferior product.

When the t-LD 30 may generate no optical beam at the shortest target wavelength $\lambda_1$ or at the longest target wavelength $\lambda$96, which corresponds to "No" at step S12, the system narrows the wavelength range as shown in FIG. 8B. That is, the system eliminates the shortest or longest target wavelength and revises the shortest and longest target wavelength to be $\lambda_2$ and $\lambda_{95}$, respectively, at step S28. Then the procedures to evaluate the parameters and the values are performed for the revised target wavelengths from step S10. The steps, S10, S12, and S18, are iterated until t-LD 30 may generate an optical beam at the revised shortest and longest target wavelengths.

Thus, according to embodiment, the system first evaluates the parameters and the values for the shortest and longest target wavelengths by setting empirically determined parameters. When the t-LD may generate an optical beam, the system performs the feedback control of the AFC and the APC to evaluate the initial parameters and the target values and stores thus evaluated information in the memory 60 as linking with the target wavelengths. Then, the system continues the evaluation for relatively shorter and longer target wavelengths by setting empirically determining parameters in the t-LD 30, confirming whether the t-LD 30 generates an optical beam or not, performing the feedback control of the AFC and the APC loop, and storing the revised parameters and the values in the memory 60. Because, a t-LD shows the optical gain thereof reducing in a peripheral wavelength range, namely, relatively shorter and longer wavelengths; the system may find a failure t-LD in an earlier stage of the evaluation.

Also, the evaluation described above changes the target wavelengths alternately between a relatively shorter one and a relatively longer one. Accordingly, the system may find a t-LD with a failure in at least one of a shorter target wavelength and a longer target wavelength in an earlier stage of the evaluation; and may reduce the possibility for wasting the parameters and the values obtained in advance of the current evaluation.

Also, according to the embodiment thus described, when the may not confirm that the t-LD 30 generates an optical beam at the shortest and/or the longest target wavelength even when the empirical parameters are set therein; the system may shift and/or narrower the wavelength range at which the t-LD 30 is necessary to generate an optical beam and iterate the evaluation of the driving parameters. Thus, even when the t-LD 30 is unable to operate in the widest wavelength range, the t-LD 30 may be approved as a limited grade product. Accordingly, When the system confirms that the t-LD 30 generates an optical beam at a revised wavelength range, the system may store information concerning to the grade of the t-LD 30 in the memory 60. The memory 60 may secure a space and an address for holding the grade of the t-LD in addition to the space for holding the initial parameters and the target values as correlating with the target wavelengths. This arrangement that the memory holds the grade of the t-LD 30 makes the management of wavelength tunable system 100 essentially simple compared with a scheme that another system that manage the wavelength tunable system 100. The memory 60 stores the initial parameters and the target values correlating only with the target wavelengths determined by the grade that is also stored in the memory 60.

Figure 9:
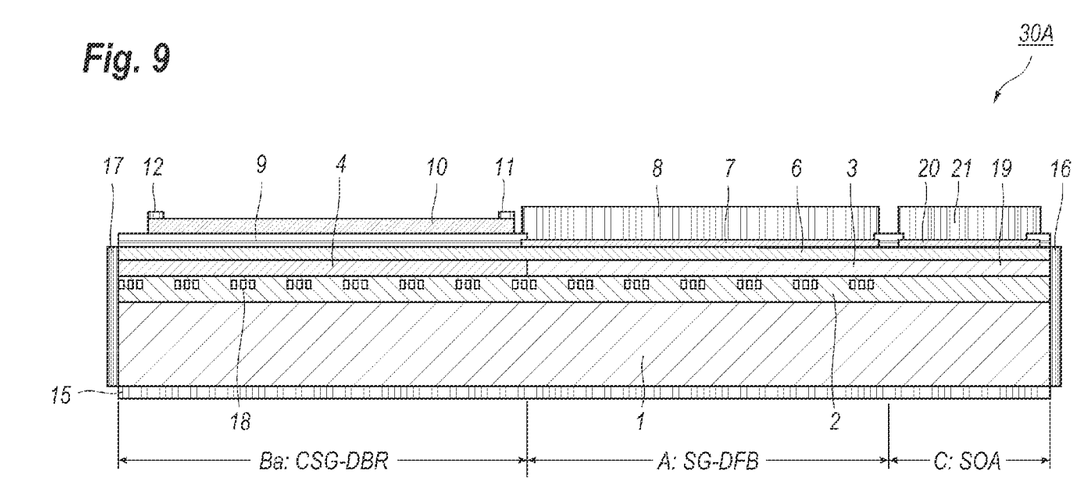
FIG. 9 shows a cross section of another t-LD according to the second embodiment of the invention.

The embodiment of the t-LD 30 thus described provides the CSG-DBR region B that prepares three heaters 10 therein. However, the t-LD 30 in the arrangement thereof is not restricted to this CSG-DBR region B. FIG. 9 shows a cross section of a t-LD 30A having another arrangement different from those aforementioned. That is, the CSG-DBR region Ba shown in FIG. 9 provides only one heater 10 and segments whose optical lengths are common in the CSG-DBR region Ba but different from that in the SG-DFB region A.

The t-LD 30A shown in FIG. 9 also shows the optical gain gradually decreasing in peripheries of the wavelength range. Accordingly, the evaluation procedures for determining the initial parameters and the target values preferably begin for the target wavelengths in the peripheries thereof. The t-LD 30 having three heaters 10 in the CSG-DBR region B shows the reduction in the optical gain thereof in the peripheries of the wavelength range that is greater than that shown by the t-LD 30A having only one heater 10 in the CSG-DBR region Ba. Accordingly, the evaluation procedures for the t-LD 30 of the first embodiment preferably begin with the shortest and the longest target wavelengths, $\lambda_1$ and $\lambda_{96}$.

The first embodiment defines that the shorter wavelength range includes three target wavelengths $\lambda_2$~$\lambda_4$, while, the longer target wavelengths includes three target wavelengths $\lambda_{93}$~$\lambda_{95}$. However, the invention is not restricted to those arrangements. The shorter wavelength range may include only one target wavelength $\lambda_2$ and the longer wavelength range may include only one target wavelength $\lambda_{95}$. Also, the shorter wavelength range may include four or more target wavelengths, and the longer wavelength range may include four or more target wavelengths. The shorter wavelength range preferably includes the second shortest target wavelength $\lambda_2$ and the longer wavelength range preferably includes the second longest target wavelength $\lambda_{95}$.

While particular embodiment of the present invention has been described herein for purposes of illustration, many modifications and changes will become apparent to those skilled in the art. Accordingly, the appended claims are intended to encompass all such modifications and changes as falling within the true spirit and scope of this invention.

I claim:

1. A method of ranking a wavelength tunable laser (t-LD) that provides a sampled grating distributed feedback (SG-DFB) region, a chirped sampled grating distributed feedback reflector (CSG-DBR) region, and a semiconductor optical amplifier (SOA) region, the t-LD being mounted on a thermo-electric cooler (TEC) that varies a temperature of the t-LD, the CSG-DBR region providing a heater that varies a temperature of the CSG-DBR region, the t-LD emitting laser light whose wavelength being to be discretely tunable within a wavelength range by setting parameters in the t-LD, the SG-DFB region having an optical gain that shows a maximum in a center of the wavelength range and becomes relatively smaller in peripheries of the wavelength range, the method comprising steps of:

driving the t-LD nearby a shortest wavelength and nearby a longest wavelength within the wavelength range by setting parameters that are empirically determined;

confirming whether the t-LD generates an optical beam whose wavelength is around the shortest wavelength and the longest wavelength in the wavelength range with and power is around a designed power, when the t-LD is unable to generate no optical beam at the shortest wavelength and the longest wavelength with the predetermined power or unstably operate, degrading a rank of the t-LD, and iterating a step of driving the t-LD at a wavelength next to the shortest wavelength and next to the longest wavelength within the wavelength range until the t-LD generate an optical beam stably, and when the t-LD is unable to emit laser light at a preset wavelength in a center portion of the wavelength range, deciding the t-LD to be in failure.

2. The method of claim 1,
wherein the step of driving the t-LD includes a step of providing bias currents to the SG-DFB region and the SOA region, power to the heater, and a current to the TEC.

\* \* \* \* \*